United States Patent [19]

Meyer

[11] Patent Number: 5,471,144
[45] Date of Patent: Nov. 28, 1995

[54] SYSTEM FOR MONITORING THE INSULATION QUALITY OF STEP GRADED INSULATED HIGH VOLTAGE APPARATUS

[75] Inventor: Thomas J. Meyer, Pinellas Park, Fla.

[73] Assignee: Square D Company, Palatine, Ill.

[21] Appl. No.: 127,207

[22] Filed: Sep. 27, 1993

[51] Int. Cl.[6] .................................................. G01R 31/12
[52] U.S. Cl. ........................ 324/551; 324/509; 324/544; 324/118; 340/647
[58] Field of Search .................................... 324/509, 510, 324/511, 541, 544, 552, 555, 118, 126, 551; 340/647, 650; 361/42, 64; 174/143

[56] References Cited

U.S. PATENT DOCUMENTS

| | | | |
|---|---|---|---|
| 3,631,329 | 12/1971 | Kimball | 324/118 X |
| 4,264,861 | 4/1981 | Radu et al. | 324/118 X |
| 4,385,271 | 5/1983 | Kurtz et al. | 324/509 X |
| 4,757,263 | 7/1988 | Cummings, III et al. | 324/552 |
| 4,896,115 | 1/1990 | Lemaitre et al. | 324/551 |

Primary Examiner—Kenneth A. Wieder
Assistant Examiner—Glenn W. Brown
Attorney, Agent, or Firm—Michael J. Femal; Richard J. Graefe; Larry I. Golden

[57] ABSTRACT

A non-ferrous current sensor is used to continuously measure the charging current magnitude in step-graded foil and paper insulation systems used on high voltage measurement and control apparatus such as instrument transformers and on the condenser bushings of power transformers and circuit breakers. The low voltage measured signal is conditioned by an electronic circuit such that it modulates a DC signal in a system current control loop to provide continuous remote monitoring and alarm functions. Remote power is supplied to the sensor and conversion circuits through the current loop. Alarm level thresholds and alarm time delay are embodied in a control device which may be located in a remote location, away from the high voltage equipment. Step-graded insulation systems form a capacitively divided circuit between the high potential and ground. As the dielectric between the foil layers breaks down, the total capacitance of the insulation system increases, producing an increase in the charging current. The sensor detects changes in the charging current through the insulation ground conductor, indicating the degradation of the dielectric properties between the foil layers. Continuous monitoring of the alarm relay contacts provide a means for reporting abnormal conditions and initiating event-based maintenance procedures. The modulation of a standard 4–20 mA current control loop allows for a multiplicity of monitoring equipment to be added to the system for additional data collection and reporting.

19 Claims, 11 Drawing Sheets

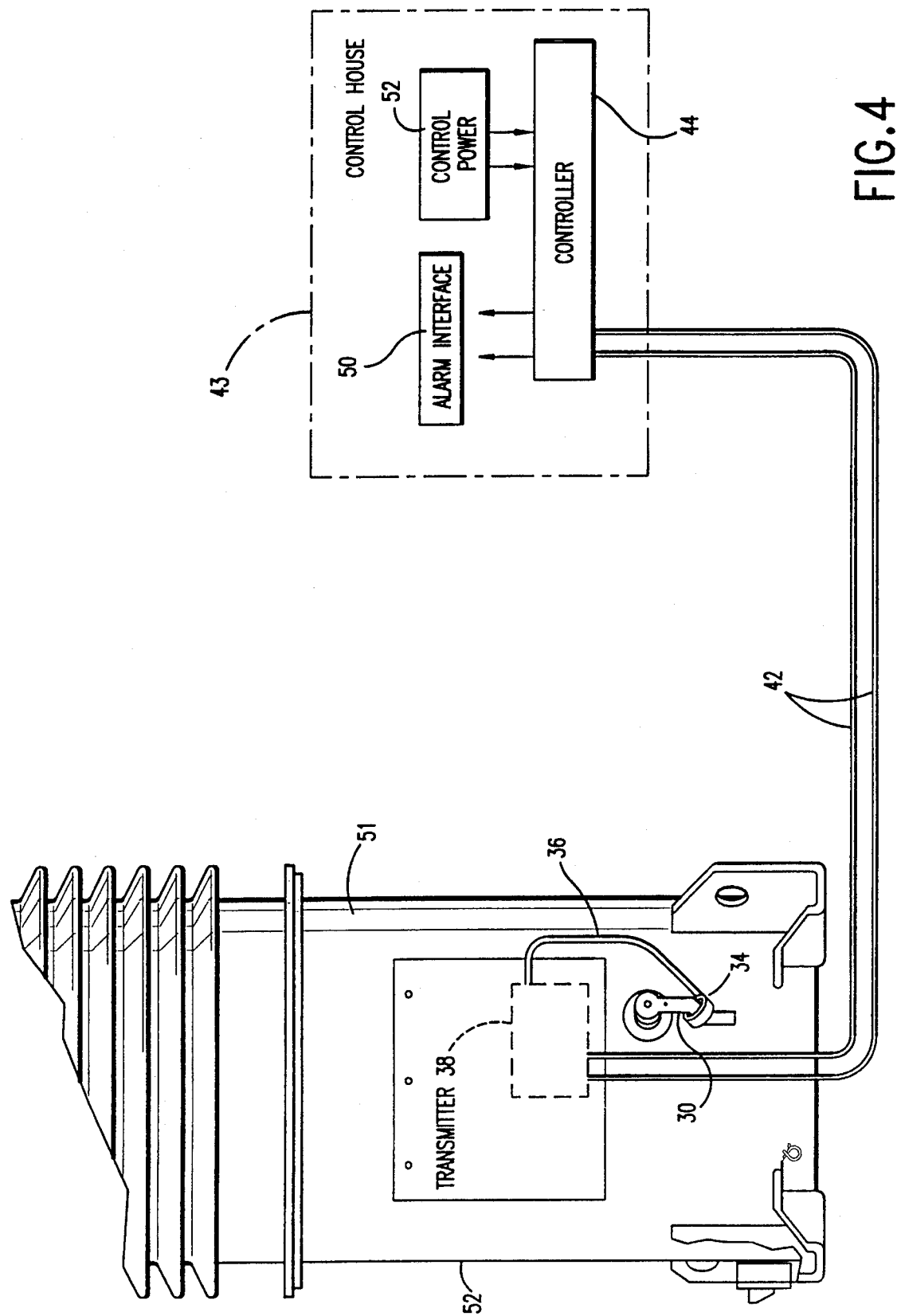

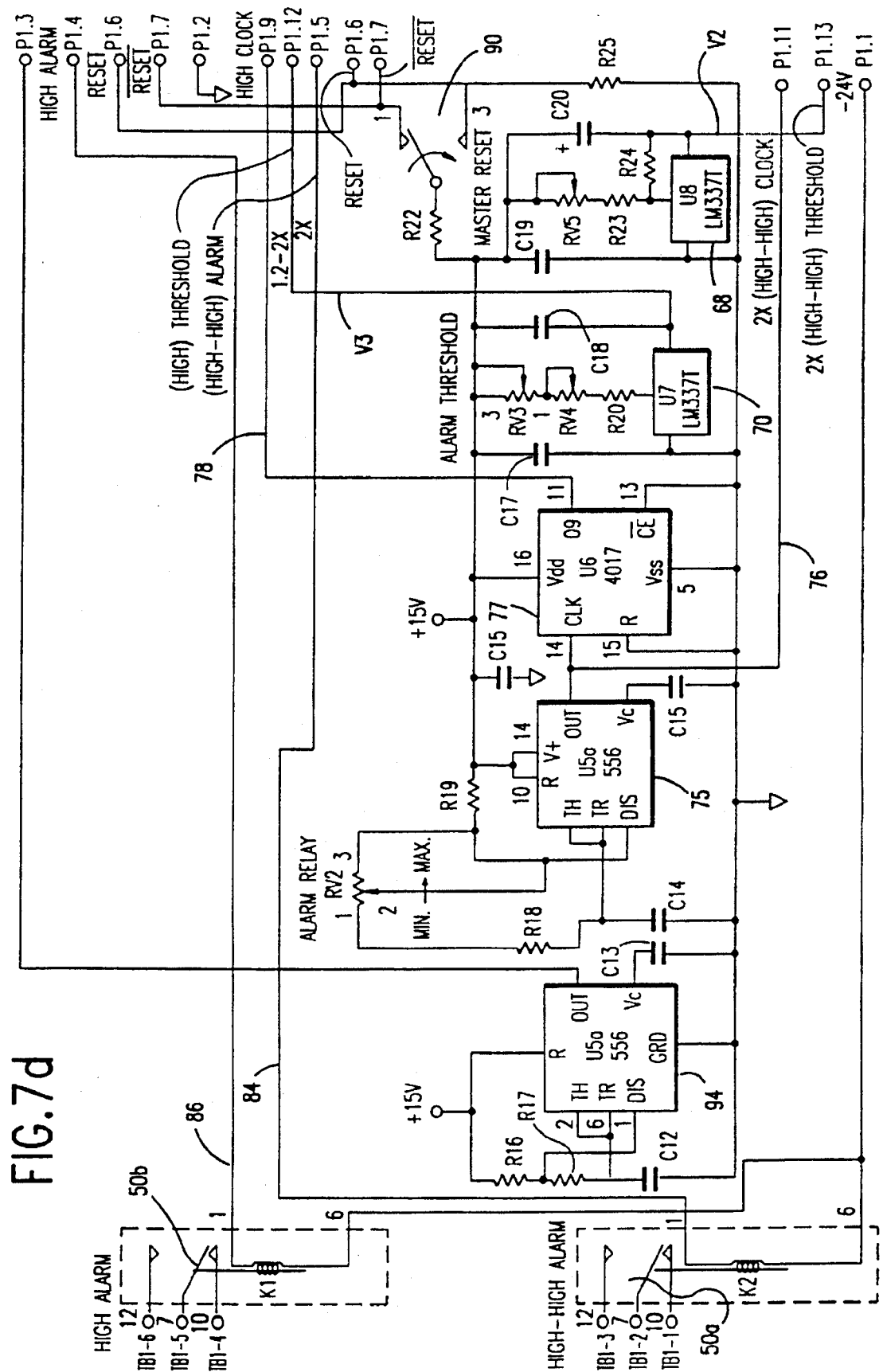

SYSTEM FOR MONITORING THE INSULATION QUALITY OF STEP GRADED INSULATED HIGH VOLTAGE APPARATUS

DESCRIPTION

1. Technical Field

Applicant's invention relates generally to a system which monitors and measures the insulation status with respect to earth ground of a high voltage electrical network and more particularly to a system that quantitatively measures the capacitively coupled charging current in a step-graded paper and foil insulation system to produce a signal output proportional to the current for continuous monitoring and alarm level detection to indicate the possibility of failure for the entire insulating system.

2. Background Art

Step-graded foil and paper insulation systems are generally employed on high voltage measurement and control apparatus such as current transformers for the purposes of protecting personnel from shock hazard and electrical instrumentation from equipment damage. Multiple alternating layers of foil and paper, with the foil layer of least potential being earth grounded, are used to form an effective series capacitive divider circuit between the high voltage conductors and ground potential. Oil impregnation of the paper dielectric is generally used in oil-filled instrument transformers, power transformers, condenser bushings and other apparatus for high voltage electrical power systems.

Most step graded insulation systems are designed such that the capacitance of each foil layer is equal, thus producing an equal voltage stress on the dielectric between each foil layer when the apparatus is energized at high voltage. In designs where each layer is of equal capacitance, the total capacitance of the insulation system is equal to the layer capacitance divided by the total number of layers. A charging current through the capacitive circuit exists and is directly proportional to the product of the line voltage, the line frequency, and the total capacitance. With the line voltage and frequency relatively constant, changes in the insulation charging current are due primarily to a degradation in the insulation system. Electrical breakdown between layers results in degradation of the oil purity which leaves carbon deposits, providing a conductive path which effectively constitutes a short circuit between adjacent foil layers. The total capacitance of an insulator exhibiting such degradation increases as the effective number of foil layers is reduced. This increase in total capacitance will increase the charging current. Furthermore, each of the remaining layers is subjected to an increase in voltage stress. Ultimately, as additional foil layers break clown, the residual voltage stress between the remaining layers may exceed safe operating levels, leading to the eventual, often catastrophic, failure of the entire insulation system.

Conventional high voltage measurement and control equipment which employ foil and paper step-graded insulation offer no inherent means for monitoring the insulation charging current. Methods have been developed for monitoring the condition of the insulation apparatus. Most of them employ off-line methods. A power factor test requires that the system be energized with a test voltage and changes in the measured power factor or capacitance over time are recorded to see if there are any significant changes that would indicate a shorted layer. Partial discharge methods are effective in detecting these changes, but must be performed off-line and may not be practical in installations where interruption of service is not economical. Another method, gas-in-oil analysis, requires an oil sample to be drawn and tested to determine the presence of various gas that are generated when the apparatus overheats, usually indicative of a breakdown of the insulation. Some other prior art systems employ a measuring resistor in series with the ground loop and measure the voltage generated by the leakage current. However, direct measurement of this voltage is often misleading due to lack of compensating networks due to the influence of the capacitance of the insulation and effects of electrical interference. Sensing the insulation charging current may not be satisfactorily accomplished by means of a resistive series element in the grounded electrode or by means of a ferrous magnetic core device. In either the resistive or ferro-magnetic sensing method, the capacitive nature of the insulation circuit between the high voltage conductor and ground is disturbed by a resistive or inductive sensor to the point where the magnitude of the insulation current is altered. U.S. Pat. No. 4,896,115 describes an on-line improvement over these common methods for monitoring the quality of electrical network insulation by coupling a reference AC signal into the system and using electronic detection circuits to determine the leakage or ground fault impedance. Other methods inject a current at a lower frequency than the network and detecting the resultant current flow in the effective leakage resistance and capacitance.

These methods, being applied off-line, are incapable of continuously monitoring for a change in the insulation charging current while the apparatus is in operation. Further, they are often intrusive to the hermetically sealed insulation common to these types of insulation systems.

SUMMARY OF THE INVENTION

Accordingly, the principal object of the present invention is to provide a method and apparatus for the continuous, on-line, conversion of the charging or leakage current of a step-graded insulated high voltage apparatus to a signal proportional to the leakage current.

A further objective of the invention is to provide an apparatus for comparing the signal proportional to the charging current with predetermined levels to indicate a change in the integrity of the insulation of the high voltage apparatus.

Yet a further objective of the invention is to provide a method and apparatus for providing a remote location for the conversion apparatus with respect to the comparison apparatus.

Another objective of the invention is to provide a method and apparatus for monitoring the leakage current of single phase and the leakage currents of polyphase high voltage systems.

In the preferred embodiment of the invention, the invention is comprised of a system of essential elements including, but not limited to, a remote sensing coil producing a voltage output linearly proportional to the insulation charging current, a remote, self powered electronic circuit coupled to the sensor which modulates a DC current control circuit proportionally to the output voltage of the sensor, and an electronic control circuit providing a suitable voltage supply for the modulated current and alarm threshold detection circuits.

The sensing coil described by the present invention utilizes a low permeability core, which may be in the form of a toroid, wound with a high number of turns to create a low inductance linear coupler from which an output voltage signal is produced which is proportional to the current in the grounded conductor passing through the center of the toroid. The linear coupler also serves to electrically isolate the sensor electronic circuits from the insulation grounding system.

The monitoring system uses a signal current modulation scheme which includes a 4 milliampere (mA) zero offset from which electrical power is derived for the remote electronic circuits and which serves to indicate that the electronics are functioning properly, even in the absence of insulation current. The zero to full scale modulation of 4 to 20 mA is used to conform to existing standards for auxiliary monitoring instruments, indicating meters, annunciators and alarm devices which may be series connected to the control current loop for additional supervisory and reporting capability. The midpoint between 4 mA and 20 mA is selected to represent the insulation current at its expected level for normal power system voltage and total insulation capacitance. That is, when the power system is energized at its nominal operating voltage and the total insulation capacitance has not been degraded from its intended initial value, the insulation charging current, will be equal to a nominal value for which the electronic circuits will cause an additional 8 mA to flow in the control current loop thereby causing a total of 12 mA in the loop. The electronic circuit is adjusted such that this same insulation charging current will produce a full scale control loop current reading of 20 mA when the insulation current reaches a value equal to twice its nominal value. Due to the proportionality of the power system voltage and the insulation capacitance to the insulation charging current, a doubling of the insulation charging current at nominal power system voltage would indicate that the total insulation capacitance has achieved a level of twice its nominal value, indicating that one half of the foil and paper layers in the insulation system have become ineffective. Alarm system thresholds may then be set between the 12 mA and 20 mA control loop current levels to indicate the degree of insulation breakdown that can be tolerated before further measures are taken to investigate the condition of the insulation system.

The system controller includes a DC voltage source from which the remote sensor electronics power supply and the modulated control loop current are derived. The controller may also include alarm circuits whereby alarm thresholds may be established and alarm contacts made to transfer when the control loop current exceeds predetermined adjustable limits. Since the insulation charging current is directly proportional to the power system voltage, and switching transients may regularly occur on the power system, these transient voltage levels on the power system will momentarily cause the insulation charging current, and hence the control loop current, to increase above their steady state levels. The alarm threshold circuits within the controller provide a predetermined delay period before initiating the transfer of the alarm contacts. This distinguishes between a short term occurrence of a switching voltage transient and a long term steady degradation of the insulation system as evidenced by a steady increase in the insulation charging current.

Other features and advantages of the invention, which are believed to be novel and nonobvious, will be apparent from the following specification taken in conjunction with the accompanying drawings in which there is shown a preferred embodiment of the invention. Reference is made to the claims for interpreting the full scope of the invention which is not necessarily represented by such embodiment.

BRIEF DESCRIPTION OF THE DRAWINGS

FIGS. 4 and 4a are typical installations of the monitoring system of FIG. 3 on an instrument transformer.

FIGS. 7a, 7b, 7c and 7d are detailed schematic diagrams of the controller illustrated in FIG. 5.

DETAILED DESCRIPTION

Although this invention is susceptible to embodiments of many different forms, a preferred embodiment will be described and illustrated in detail herein. The present disclosure exemplifies the principles of the invention and is not to be considered a limit to the broader aspects of the invention to the particular embodiment as described.

Figure 1:
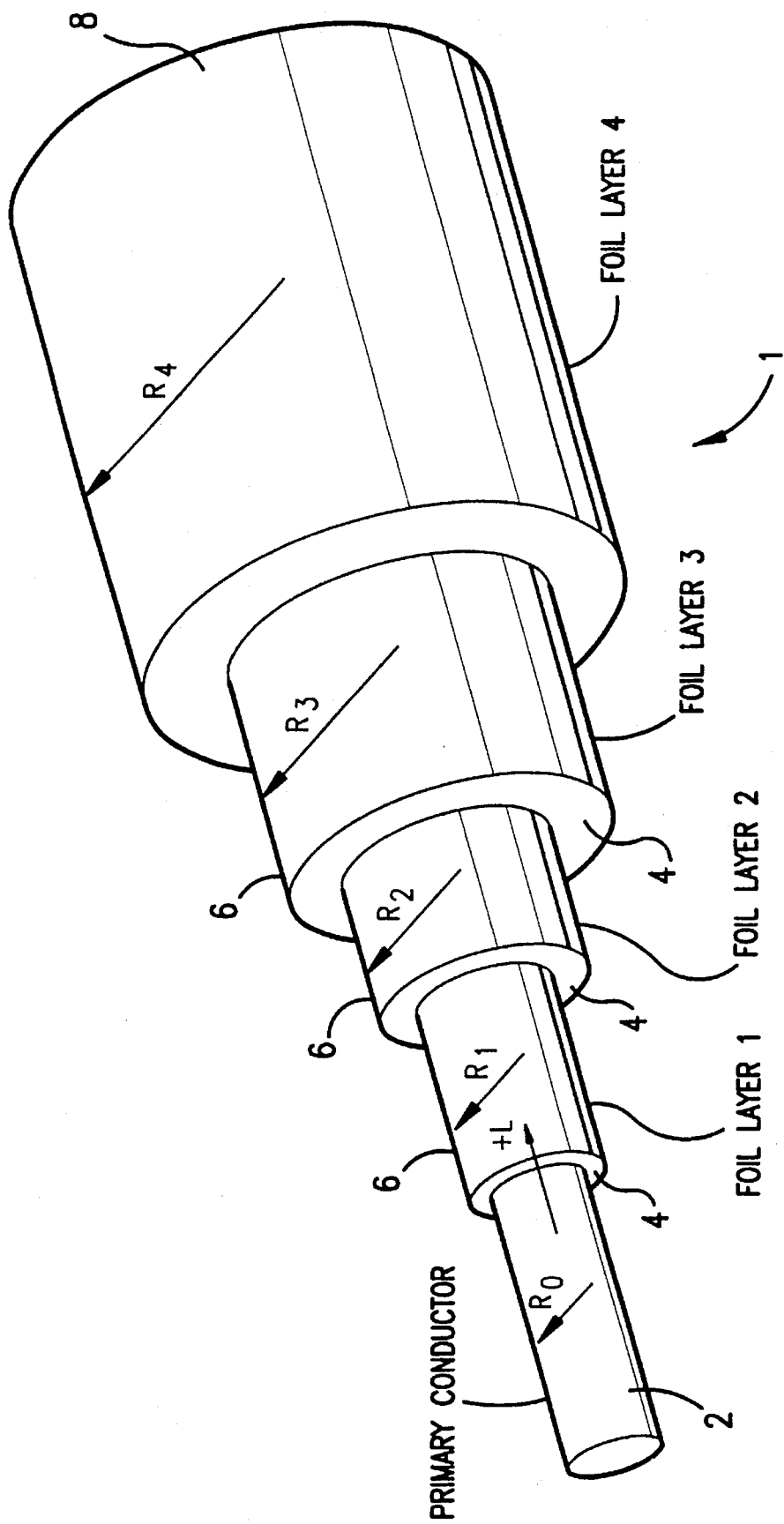
FIG. 1 illustrates the construction of a step graded foil and paper insulator showing the alternating layers of foil and paper.

FIG. 1 shows the typical construction of a step-graded paper and foil insulation system 1 where the high voltage conductor 2 is wrapped with alternating layers of paper 4 and conductive foil 6. Thus, as the foil layers are added to the insulation system, the radius from the high voltage conductor to the foil layers tends to increase. The capacitance value between any two adjacent foil layers is directly proportional to the length of the layer and inversely proportional to the LOG ratio of the outside to inside radius of the layer. In order to maintain equal capacitance values from layer to layer, the length of the foil layers are adjusted to account for the radial buildup. This construction serves to insulate the outermost layer 8, usually at ground potential, from the high voltage conductor 2.

Figure 2:
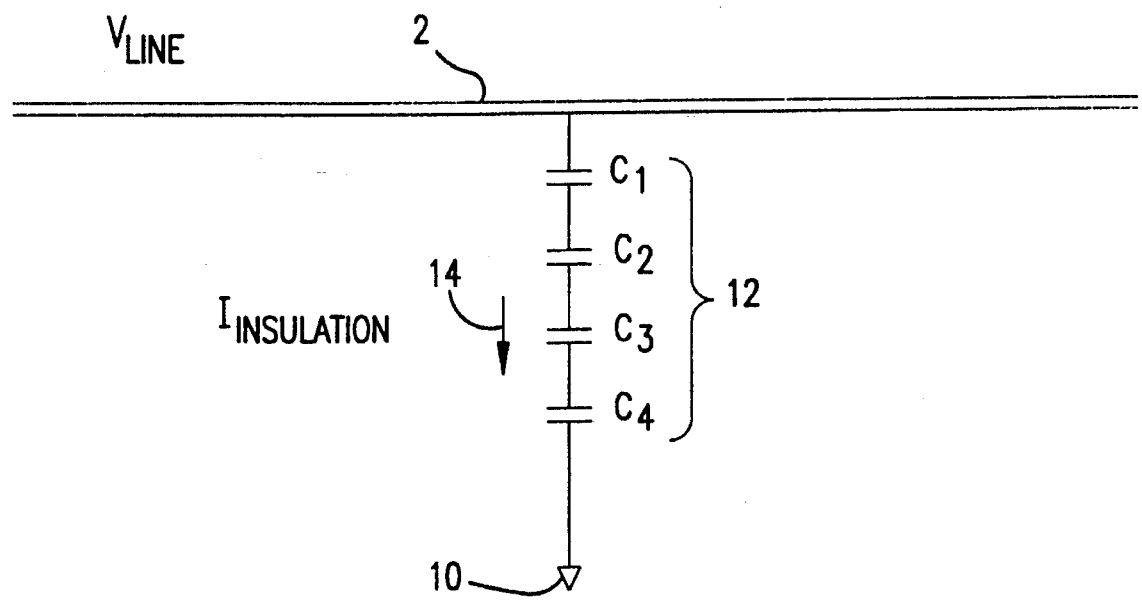
FIG. 2 is an electrical schematic of the capacitive divider circuit formed by the insulation structure of FIG. 1.

A simplified electrical schematic diagram of the insulation system 1 as it forms a series capacitance circuit from the high voltage conductor 2 to ground 10 is shown in FIG. 2. With the number of capacitors equal to the total number of foil layers, a capacitive voltage divider 12 is formed. The total capacitance of the series capacitors, with equal valued capacitors, is equal to the layer capacitance divided by the number of layers. The actual equivalent circuit will consist of many parallel capacitors created by the capacitances that exists between noncandidate layers. The electrical current 14, also called the charging current, which flows through the capacitor circuit is proportional to the voltage of the high voltage conductor 2 and the total capacitance 12, based on the relationship that $$I = V * jw * C_{total}$$

where $$C_{total} = 1/C1 + 1/C2 + 1/C3 + 1/C4$$

On a typical 345 kV high voltage current transformer, the total capacitance may be approximately 705 pf. Operating on a 345 kV line, the line to ground voltage is about 200 kV and the charging current 14 is nominally 53 mA. Under normal operating conditions, the high voltage AC signal 2 has a relatively constant amplitude and frequency. Thus, the charging current 14 remains relatively constant in amplitude and frequency as well. Changes in the capacitive insulation structure, however, will produce changes in the amplitude of the charging current. Using the circuit shown in FIG. 2 as an example, a voltage breakdown between two adjacent foil layers will effectively reduce the total number of layers by 1, which in turn increases the total capacitance 12 by a factor of ⅓. This will cause a proportionate in;crease in the charging current 14 to over 30 mA. Although FIG. 2 only shows four layers, more typical systems will use 10 to 30 layers, depending on the voltage class of the unit.

Figure 3:
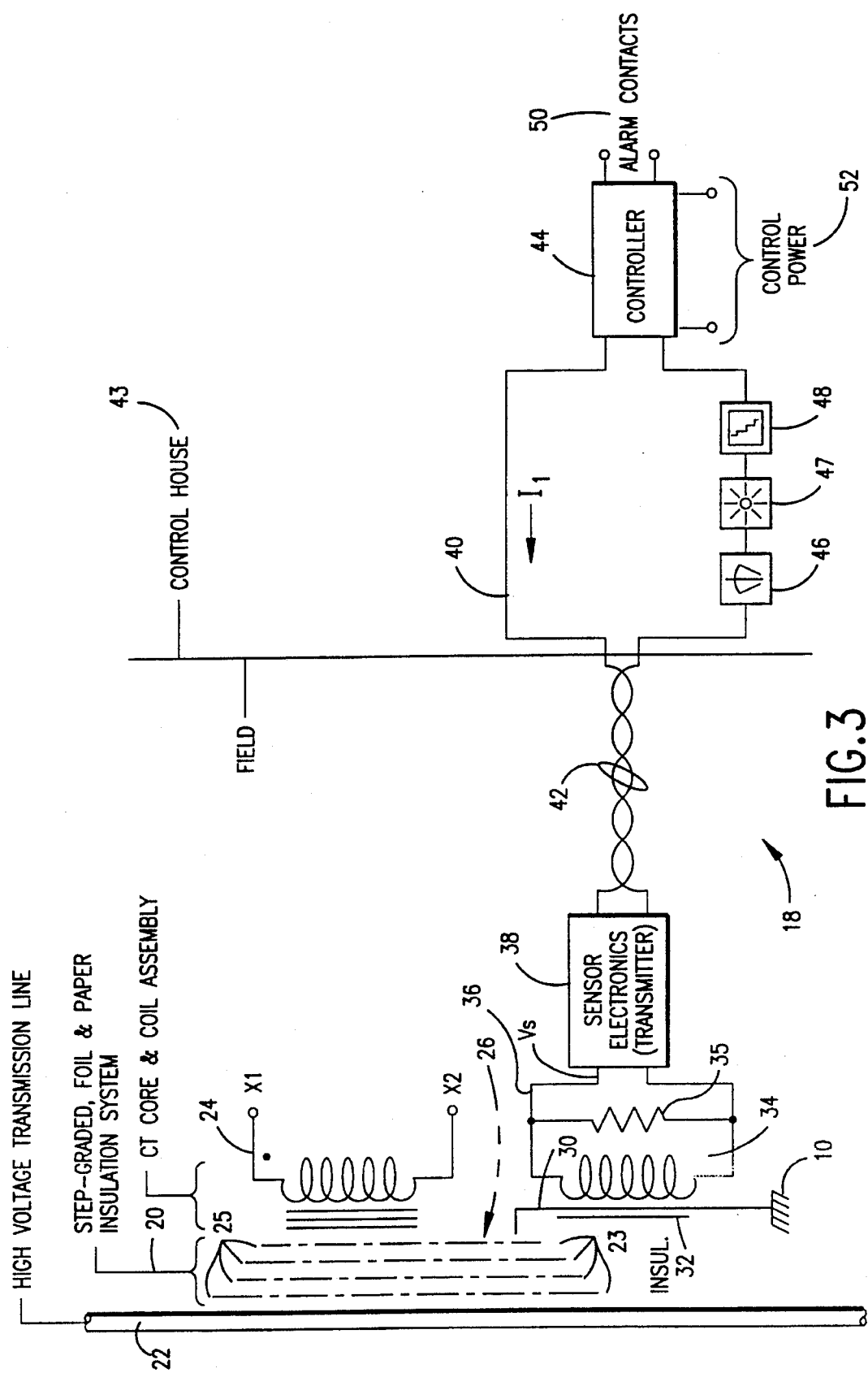
FIG. 3 is a block diagram of the essential elements in the monitoring system of the present invention.

FIG. 3 illustrates an entire insulation current monitoring system 18 in a block diagram according to the present invention. A step-graded foil and paper insulation system 20 insulates a high voltage conductor 22 from a transformer core and coil assembly 24. The step-graded insulation system includes alternate layers of paper 23 and foil 25. The lowest potential foil layer 26 is electrically connected to ground 10 with a conductive element 30 which provides a ground path for the insulation charging current 32. A wound, non-ferrous toroidal coil assembly 34 is positioned such that the ground conductor 30 passes directly through the center of the toroidal coil, such that the coil 34 links all of the magnetic flux generated by the charging current 32 passing through the conductor 30. The non-ferrous nature of the coil assembly 34 results in a low inductance coupling back into the series capacitive circuit of the insulation 20 and, therefore, does not alter the magnitude of the charging current 32 being measured. A burden resistor 35 internal to the assembly 34 produces a voltage Vs that is proportional to the charging current 32. The coil assembly 34 also serves to electrically isolate the current monitoring system circuits 18 from the insulation grounding system. Because of the high voltage and currents associated with the system, the coil assembly will have some type of shielding to prevent inductive coupling of adjacent and unwanted magnetic fields.

The coil assembly 34 is electrically connected to a sensor electronic circuit or transmitter 38 by means of a shielded, twisted pair, or other suitable, cable 36. The transmitter 38 performs the functions of amplifying and rectifying the sensor voltage signal Vs. Output driver circuits in the transmitter 38 are used to modulate a DC current I1 in a control loop 40. The modulation results in the current signal I1 containing a proportionate magnitude of the charging current 32. The control loop 40 conforms to a standard 4–20 mA loop and the cable 42 which electrically connects the transmitter 38 to a controller 44 is also a shielded, twisted pair or other suitable cable. The controller 44 may be located in a benign control house 43 environment. The control house 43 and the transmitter 38 can be separated by up to 1,000 feet. Auxiliary devices may include meters 46, alarms 47 or recorders 48 that can accept the 4–20 mA signal and are series connected in the control loop 40 to provide additional control or monitoring functions.

Controller 44 performs one or more essential functions. The controller 44 includes a DC voltage source, which may provide as much as 30 to 40 volts, and which has the capability of providing 20 mA full scale modulated current in the control loop 40. The current which flows from the voltage source is strictly modulated by the sensor electronics alone, yet the terminal voltage across the controller 44 output is determined by a nominal voltage level required to excite the remote power supply circuits in the transmitter 38, and by the voltage drops associated with the current in the control loop 40 and the impedance of any auxiliary devices 46–48. The output of the controller 44 are alarm contacts 50 which operate at a predetermined, settable level of leakage or charging current 32 to indicate a change in the insulation charging current 32 of the insulation system 20. If a polyphase system is being monitored, the controller 44 is capable of receiving inputs from transmitters and control loops similar to transmitter 38 and control loop 40.

The insulation current monitoring system 18 is powered by control power 52 which is inputted to the controller 44. The signal current modulation scheme includes a 4 mA offset zero from which electrical power is derived for the remote transmitter 38, eliminating the need for auxiliary power at the high voltage apparatus that is being monitored.

FIG. 4 shows a typical installation of the insulation current monitoring system. An instrument transformer 51, utilizing a step graded foil and paper insulation system, is shown with the tank 52 at ground potential and the grounded lead 30 from the insulation system brought through the tank wall 52 and the sensing coil 34 before being electrically grounded to the tank 51 itself. The insulation charging current 32 which flows through conductor 30 is sensed by the sensing coil 34, whose output signal Vs is then coupled by cable 36 to the transmitter 38 so as to modulate the current I1 in the control loop 40 coupled by cable 42 to the controller 44 in the control house 43. The controller 44 provides remote power to the sensor electronics and monitors the charging current levels in the control current loop 40 as previously described. Only a single phase system is shown and would be typical of a retrofit. As an alternative, the sensing coil could be located inside the tank 52 immersed in oil, for instance.

Figure 5A:
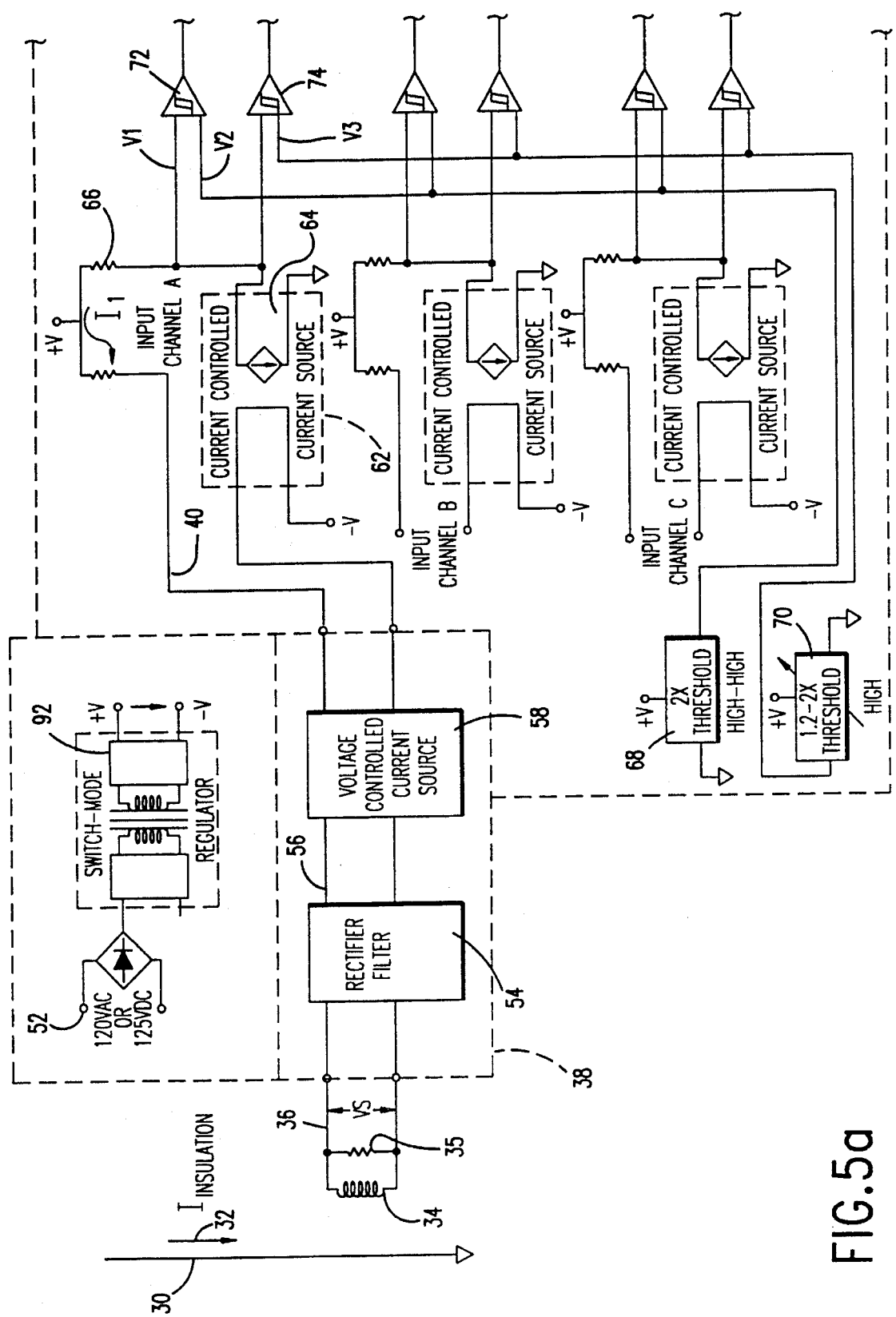
FIG. 5 is a detailed block diagram of the monitoring system of the present invention as shown in FIG. 3.
Figure 5B:
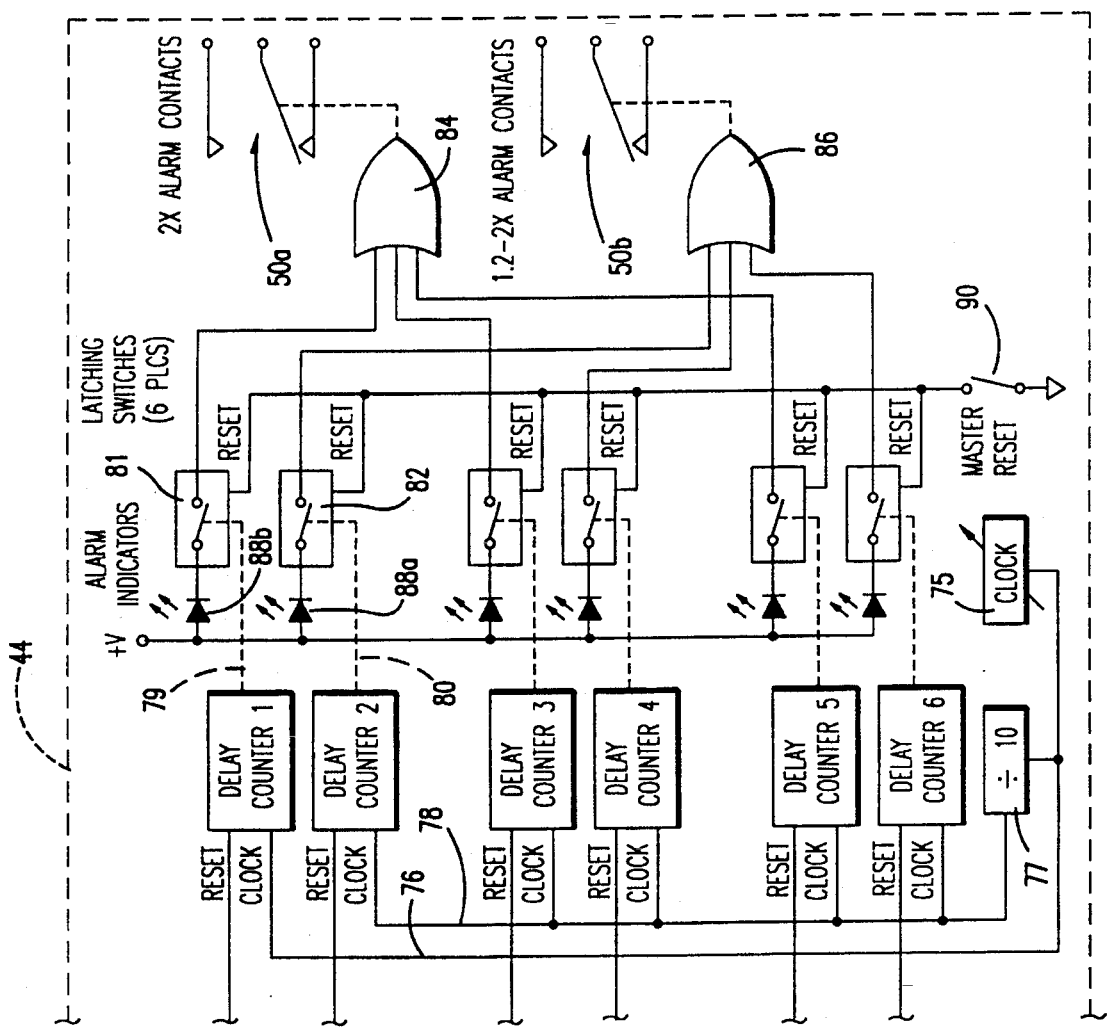

Operation of the insulation current monitoring system 18 can be best understood with reference to FIG. 5 which is a detailed block diagram of the preferred embodiment of the present invention. The grounded foil layer 26 has its ground lead 30 pass through the sensing coil 34 such that the output voltage Vs of sensor 34 is proportional to the insulation charging current 32 and is coupled to the transmitter 38. For the low leakage currents being measured, it has been found that a proportionality factor or ratio of fifty microvolts per one miliampere of charging current provides an adequate degree of sensitivity. A combination filter, amplifier and rectifier circuit 54 develops a DC voltage signal 56 from voltage Vs that remains proportional to the charging current 32. A voltage controlled current source 58, where the generated current is proportional to the voltage 56, is used to modulate a 4–20 mA current loop 40 for inputting to channel A of controller 44. Controller 44 is shown for a three phase system, but with only phase A sensor 34 and transmitter 38 shown. Additional sensors and transmitters would be required for a three phase system.

The current I1 flowing in the current loop 40 is coupled to the controller via a twisted pair cable 42 as previously detailed. The current controlled current source 62 is calibrated such that, for zero charging current 32, i.e., the high voltage apparatus being monitored is not energized, 4 mA of quiescent current is flowing in loop 40. This quiescent current is used to provide power for the sensor 34 and transmitter 38. With the high voltage apparatus energized during initialization, usually during installation, the voltage controlled current source 58 is adjusted to provide 12 mA of loop current. This represents the expected charging current 32 when the high voltage apparatus is operating at its nominal operating voltage. Thus 100% (1×) of initial charging current equals 8 mA. Since there is a linear relationship between the charging current 32 and the loop current I1, 200% (2×) of charging current will equal 2×8 mA or 16 mA which is added to the 4 mA of quiescent current to create 20 mA of loop current I1. A current mirror 64 generates a voltage V1 across resistor 66. V1 is calibrated to be proportional to the charging current 32.

A 2× threshold level generator 68 and an adjustable 1.2–2× threshold level generator 70 generate voltage levels V2, V3, respectively. V2 is set such that voltage V1, with 20 mA of loop current I1, will equal V2. V3 is adjusted within the range 1.2–2× or 13.6–20 mA of loop current I1 for a similar relationship with V1. Schmitt trigger 72 compares V1 with V2 and will enable delay counter 1 when V1 exceeds V2, indicative of an increase in the charging current 32 to a level that is twice the original current resulting from a breakdown in the insulating layers of high voltage apparatus. Schmitt trigger 74 compares V1 with V3 in a similar fashion.

Since switching transients may regularly occur on the power system, voltage levels on the power system will momentarily cause the insulation charging current 32, and hence voltage V1, to increase above their steady state levels when such transient conditions occur. Delay counters 1–6 provide a predetermined delay period before initiating the transfer of the alarm contacts 50a, b. This distinguishes between a short term occurrence of a switching voltage transient and a long term steady degradation of the insulation system as evidenced by a steady increase in the insulation charging current. Clock 75 produces a timing pulse 76 for the delay counters 1, 3 and 5, with a divide by ten circuit 77 providing timing pulse 78 having a longer time delay for counters 2, 4, and 6 that monitor the lower levels of charging current 32 in the 1.2–2× range. The clock rate for the 2× alarm level is adjustable and can provide up to 30 seconds of delay.

If the charging current 32 exceeds the 2× or adjustable thresholds 68, 70 for a period longer than the time duration of the delay counters 1–6, outputs 79 or 80, depending on which threshold was exceeded, will energize latching switches 81, 82 respectively. This will in turn energize the 2× or 1.2–2× alarm contacts 50a or 50b respectively through one of the "OR" function 84, 86. Alarm indicators 88a or 88b will display the appropriate cause of the trip. The outputs will remain in a tripped state until a master reset 90 is operated. Latching switches 81, 82 are used so as to provide memory of the condition if control power is interrupted at any time after a trip operation.

Channels B and C will perform in the same manner. OR 84 will operate the 2× alarm if any of the three phases exceeds the 2× level for the preset time delay period and OR 86 will operate the 1.2–2× alarm if any of the three phases exceeds that level for the other preset time delay period. Power for the system is supplied by a switchmode regulator 92, the details of which are well known and are not an object of the present invention.

Figure 6:
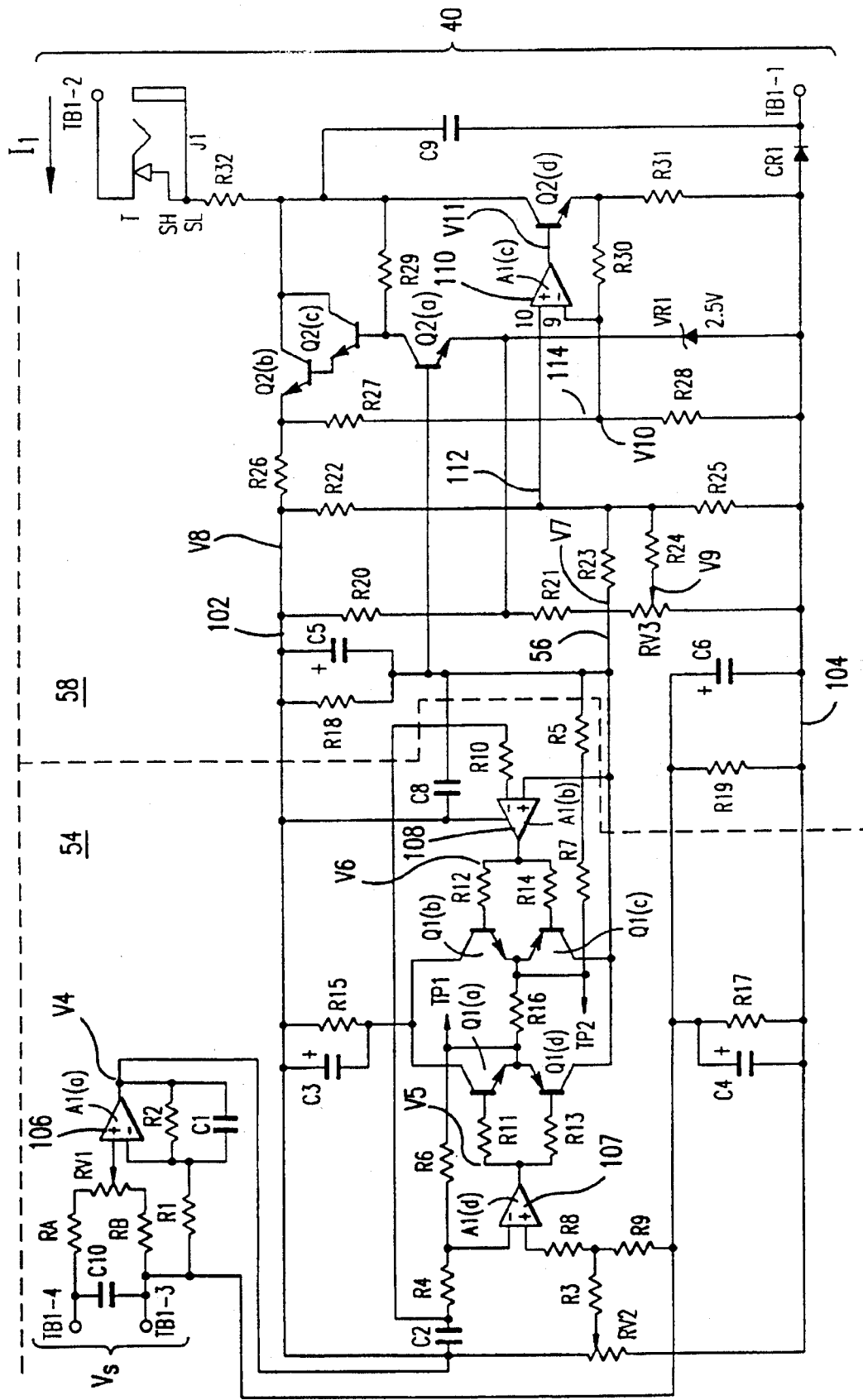
FIG. 6 is a detailed schematic diagram of the remote sensor illustrated in FIG. 5.

FIG. 6 details the transmitter 38 consisting of the rectifier circuit 54 and voltage controlled current source 58. Current loop 40 is connected to terminals TBl-1 and TB1-2. The 4 mA quiescent current of the loop current I1 creates a 6 volt rail between 102 and 104 through the action of zener diode VR1 and transistors Q2a, b, and c. The 4 mA of current flowing in the current loop 40 is sufficient to provide base drive at node 110 for darlington connected transistors Q2b and c. Transistor Q2a will conduct, allowing zener diode VR1 to also conduct, building a voltage at node 110. Regardless of any increase in the loop current, the rail voltage will remain relatively constant and regulated near the 6 volt level.

The output voltage Vs of sensor 34 which is proportional to the insulation charging current 32, is inputted to terminals TB1-3 and TB1-4. Changing the resistance values of resistors RA and RB provide a means for using the insulation current monitor 18 for different levels of charging current 32, based on the magnitude of the high voltage line and the total capacitance of the insulated apparatus that the insulation current monitor 18 is monitoring. These resistors, along with potentiometer RV1, scale the incoming voltage Vs to the fixed gain of buffer amplifier 106, which can be an operational amplifier for greater temperature stability. The gain is selected such that AC output voltage V4 does not saturate at the 200% level of allowable insulation charging current 32. Since Vs is scaled to be fifty microvolts per one milliampere of charging current, the gain of the amplifier 106 has to be quite high. A two stage cascaded amplifier is employed with the first stage, amplifier 106 providing half of the required gain so as to allow the full peak to peak voltage swing of Vs to be amplified within the voltage rails 102, 104. The higher gain of the first stage will also reduce the effects of the DC offset levels of the operational amplifiers on the following stages, amplifiers 107 and 108 which only will require a gain of –3 and +3, respectively, and the full wave rectification circuitry. Capacitor C2 couples voltage V4 to amplifiers 108 and 110 which function to generate voltages V5, V6 respectively, that are equal, but phase shifted by 180 degrees. As a result, resistor R16 becomes a load resistor that produces a full wave rectified voltage V7, which is the DC voltage signal 56 as referenced in FIG. 5, through the alternate conduction of transistor pairs Q1a, Q1c and Q1b, Q1d. Voltage V7 is positive with respect to the voltage rail 104. RC network C4-R17 provides a DC filter for the rectified voltage V7 and the C3-R15 combination provides a balance with the positive DC rail 102. Calibration of the rectifier circuit 54 is accomplished by adjusting potentiometer RV2 for zero voltage across R16 with voltage Vs not present.

The voltage controlled current source 58 portion of transmitter 38 modulates the 4–20 mA current loop 40 through the action of summing amplifier 110 and the voltages at nodes 112 and 114. The voltage at node 112 comprises voltage V7, which is proportional to the charging current 32, a current reference signal V8 derived from voltage divider R22 and R25, and an adjustable voltage offset signal V9 derived from divider R21 and RV3. The voltage at node 114 is a current sample signal V10 derived from current sense resistor R26. Amplifier 110 subtracts the voltage across R26 from the offset voltage to compensate for changes in current loading of the transmitter circuit 38 whereby the output voltage V11=V7+V8+V9–V10. The output voltage V11 provide base drive for transistor Q2d which modulates current I1 in current loop 40. With no signal present at terminals TB1-3, TB1-4, potentiometer RV3 is adjusted to provide 4 mA of current in current loop 40. With 100% of predetermined charging current, as represented by input voltage Vs at input terminals TB1-3, TB1-4, potentiometer RV1 is used to adjust the gain of the amplifier stages such that the current I1 in current loop 40 is equal to 12 mA. This will result in I1 equalling 20 mA of current with 200% of charging current 32 present. 200% of insulation charging current is generally considered a trip level.

Figure 7A:
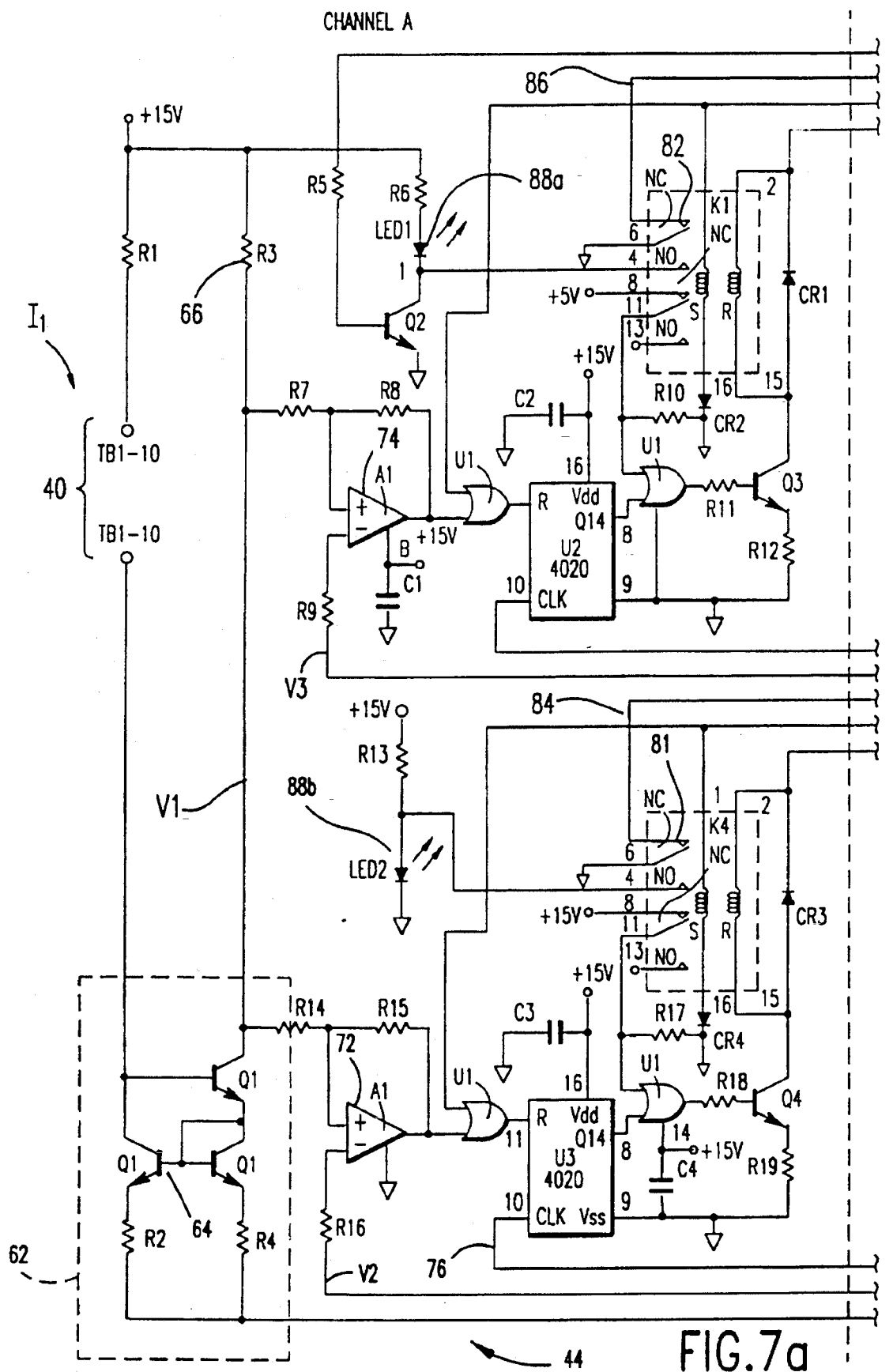
Figure 7B:
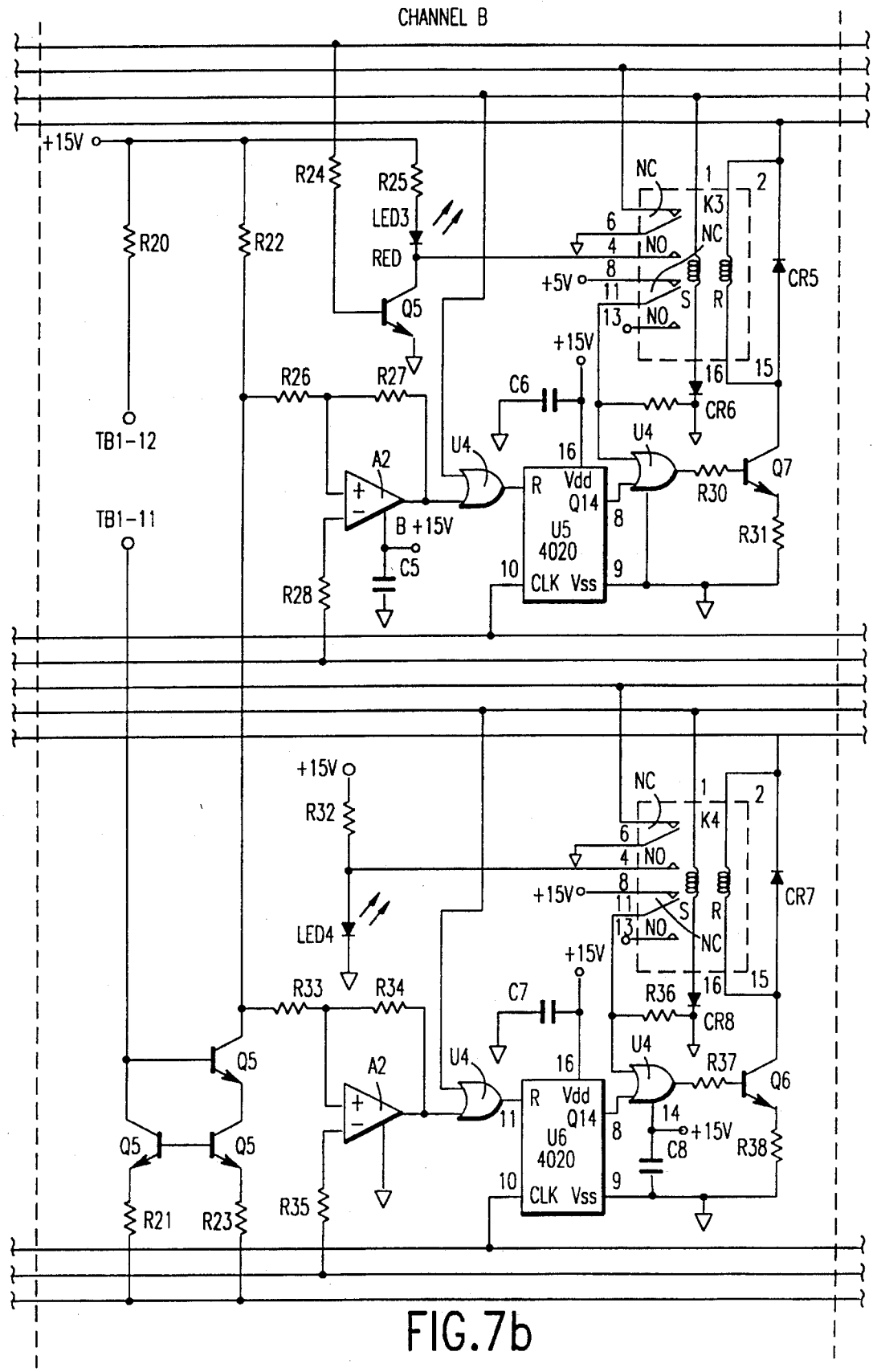
Figure 7C:
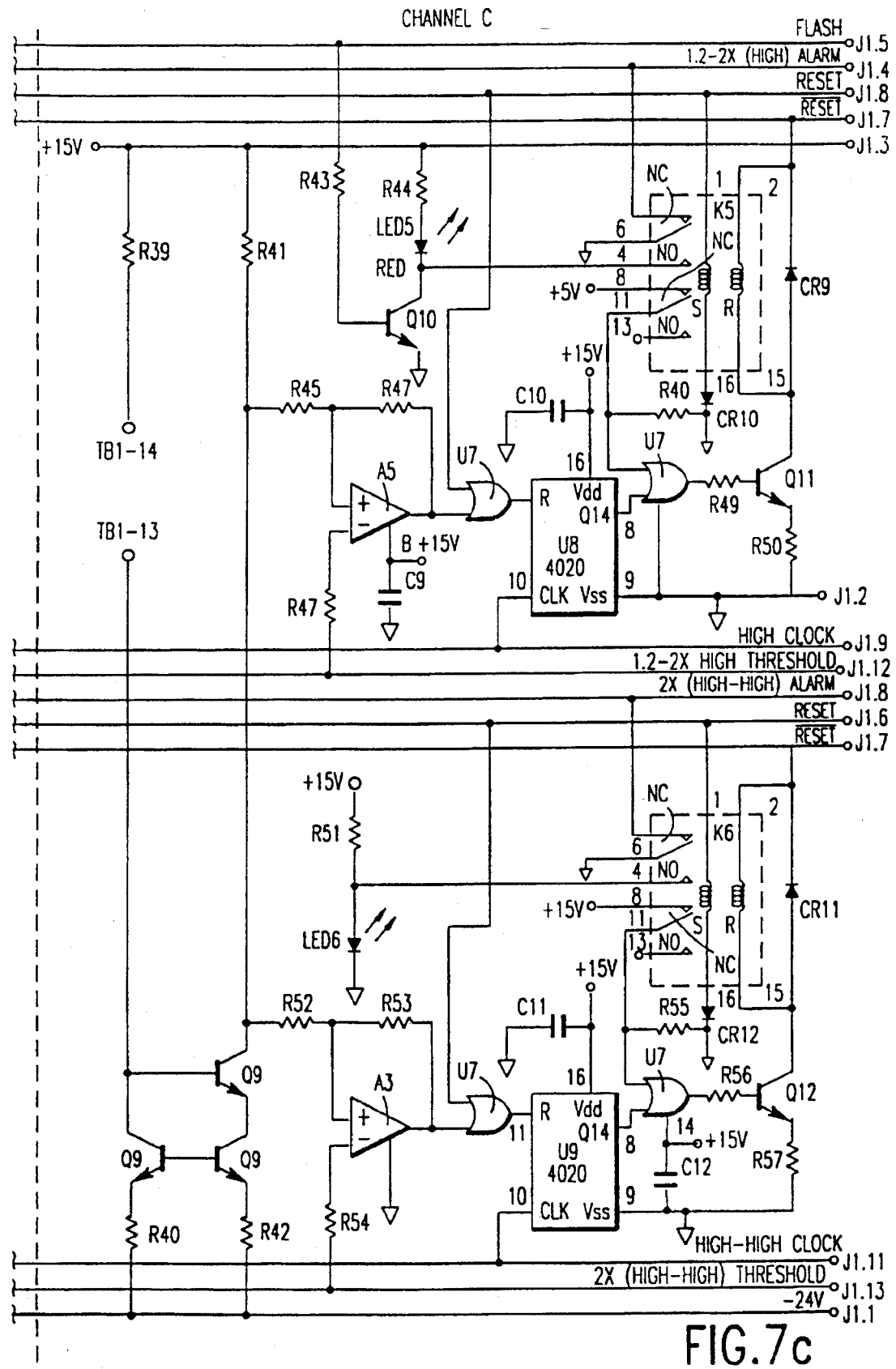

As shown in FIGS. 7a, b the output of the transmitter 38 is coupled to the controller 44 by current loop 40. Controller 44 is shown for a three phase system, but only channel A will be described. The current controlled current source 62 consists of a current mirror 64 which generates a voltage V1 across resistor R3. V1, due to the previous calibration of current I1 in the current loop 40, is proportional to the charging current 32. V1 is coupled to two similar circuits, one for generating an alarm if the charging current is twice the preset 100% level and the other if the charging current exceeds an adjustable level in the 1.2–2× range. Voltage regulator U7 is calibrated by potentiometer RV4 to generate the 1.2–2× threshold voltage level V3 and voltage regulator U8 is user adjusted by potentiometer RV5 to generate the variable 2× threshold voltage level V3. Schmitt trigger 72 compares V1 with V2 and will enable counter U3 when V1 exceeds V2, indicative of an increase in the charging current 32 to a level that is twice the original preset 100% current level. Schmitt trigger 74 compares V1 with V3 in a similar fashion. Hysteresis provided by the Schmitt triggers 72, 74 prevents chattering of the alarm circuits. Timer U5b functions as clock 75 of FIG. 5 for producing the timing pulse 76, referred to as a high-high clock, that is used by the delay counters 1, 3 and 5. The divide-by-ten circuit 77 is accomplished by counter U6 which provides timing pulse 78, referred to as a high clock, having a longer time delay for counters 2, 4 and 6. The clock rate is adjustable and could provide up to 30 seconds of delay. Delay timer U3 will start counting timing pulse 76 when the charging current 32 exceeds the 2× threshold voltage V2 and its output will turn-on transistor Q4 at the end of the delay time.

Latch relays 81, 82, and their counterparts in channels B and C are normally in the set state and reset when an alarm situation exists. At initial power-up, master reset switch 90 is depressed. This supplies V+ voltage through resistor R22 to the set coil of the respective relays, energizing them. Releasing the reset switch 90, removes the voltage from the set coil and provides V+ to the reset coils. The output contacts of the relays will be set. Indicator 88b will be off and indicator 88a will be on steady, indicating that the system is energized and the charging current 32 is below the trip levels. Q4 will energize the reset coil of relay 81 if the delay time period is exceeded in the presence of an alarm condition and the contacts of relay 81 will again change to a reset state. This will provide a ground to signal line 84 which is wired in parallel with the corresponding contacts from channels B and C. This will in turn energize the 2× relay K2 and alarm contacts 50a will close. Another pair of contacts from relay 81 opens and allows indicator 88b or LED 2 to turn-on. LED 2 will remain on until the system is reset. If power is removed from the current monitor, which in some cases is probable, restoring power will result in the reset coil being energized through the V+ voltage on one NC contact energizing transistor Q4 directly through the "OR" U1. This will provide a means for immediately indicating that a trip has occurred without having to wait for the normal time delay. The 1.2–2× circuit functions in a similar manner, with the only differences being that the time delay is longer due to the divide-by-ten circuit 77 and the indicator 88a flashes instead of being on steady when a trip occurs. Clock 94 is a free-running pulse generator that provides base drive on signal line FLASH for transistor Q2 when Q2 is not shorted out by the NO contacts of relay 82, causing LED 1 to flash at the clock rate. Line 86 is wired in parallel with the corresponding contacts from channels B and C to provide another OR function. A ground on this line will in turn energize the 1.2–2× relay K1 and alarm contacts 50b will close. The outputs will remain in a tripped state, again until the master reset 90 is operated.

Figure 4A:
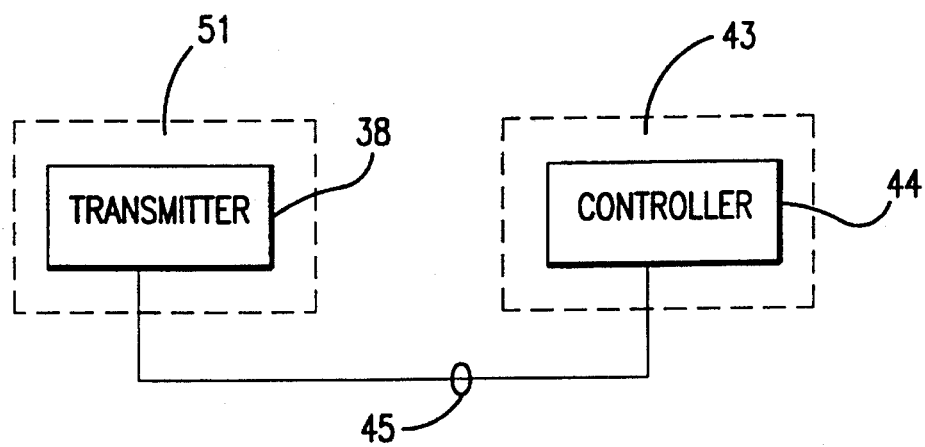

While the specific embodiments have been illustrated and described, numerous modifications are possible without departing from the scope or spirit of the invention. One possible embodiment is to replace the current loop 42 with a modulated fiber optic cable 45 as shown in FIG. 4A. The transmitter portion 38 of FIG. 4 would include the electronics to convert the charging current 32 to an equivalent fiber optical modulated light signal to the 4–20 mA current loop, the details of which are well known to those skilled in the art. The controller 44 would contain the necessary decoder to demodulate the light signal to input to the Schmitt triggers and other related circuits previously described.

I claim:

1. An insulation monitoring system for measuring a charging current through an insulation system between a high voltage conductor and earth ground, said insulation monitoring system comprising:

a. an AC current sensor for measuring said charging current and for converting said charging current to a first voltage signal proportional to said charging current;

b. a transmission network;

c. a transmitter coupled between said AC current sensor and said transmission network, said transmitter having electronic circuit means for converting said first voltage signal to a DC current and modulating a first current signal by said DC current for transmission over said transmission network, said modulated first current signal proportional to said charging current;

d. a controller for generating said first current signal and coupled to said transmitter by said transmission network to receive said modulated first current signal, said controller for demodulating said modulated first current signal to extract said DC current, converting said DC current to a voltage proportionally to said charging current, comparing said proportional voltage with a preset voltage level, and generating an alarm signal when said proportional voltage exceeds said preset voltage level; and e. wherein said insulation monitoring system continuously monitors said insulation system.

2. The insulation monitoring system of claim 1 wherein said AC current sensor comprises a wound toroidal coil assembly responsive to said charging current in a conductor passing through said toroidal coil without disrupting the nature of a source circuit generating said charging current to be measured and said coil assembly further having means, responsive to said charging current, for developing a linearly proportional voltage signal and means for delivering said voltage signal to said transmitter.

3. The insulation monitoring system of claim 1 wherein said transmission network is a 4–20 milliampere current loop.

4. The insulation monitoring system of claim 3 wherein said transmitter further includes means for generating regulated control power from a quiescent current level of 4 milliamperes from said current loop for powering its electronic circuit means.

5. The insulation monitoring system of claim 4 wherein said electronic circuit means in said transmitter further includes means for filtering, amplifying and averaging said first voltage signal to produce said DC current made proportional to said charging current.

6. The insulation monitoring system of claim 5 wherein said filtering, amplifying and averaging means in said transmitter includes a full wave rectifier to generate a full wave rectified voltage proportional to said charging current.

7. The insulation monitoring system of claim 5 wherein said electronic circuit means in said transmitter further includes means for modulating said first current signal between the bounding values of 4 milliamperes and 20 milliamperes in response to said charging current with said DC current.

8. The insulation monitoring system of claim 7 wherein said modulating means includes a comparator which monitors said quiescent current, computes the difference between said quiescent current from a constant reference value and modulates said current loop by an amount equal to said difference and said full wave rectified voltage.

9. The insulation monitoring system of claim 3 wherein said current loop allows peripheral devices to be coupled to said current loop, said devices including meters, alarms, and recorders connected in series and that can accept the 4–20 milliampere signal to provide additional control and monitoring functions.

10. The insulation monitoring system of claim 1 wherein said controller coupled to said transmission network further includes means to supply power to said transmitter through said transmission network, means to provide for adjustable alarm threshold levels of said charging current, and means to provide for adjustable time delayed operation of said alarm levels when said alarm threshold levels are exceeded.

11. The insulation monitoring system of claim 10 wherein said adjustable alarm threshold levels include an alarm for exceeding said charging current by an adjustable multiple between one and two times said charging current, and a separate alarm for exceeding said charging current by a multiple of two times said charging current.

12. The insulation monitoring system of claim 10 wherein said controller further includes means to couple separate transmission networks for monitoring the charging current of polyphase high voltage systems.

13. The insulation monitoring system of claim 1 wherein said insulation system is a step-graded insulation system.

14. The insulation monitoring system of claim 1 wherein said transmission network is a fiber optic network system.

15. A method of monitoring insulation between a high voltage conductor and earth ground, said high voltage conductor and said earth ground comprising part of a high voltage system, said insulation monitoring method comprising:

a. sensing a charging current between said high voltage conductor and said earth ground;

b. converting said sensed charging current to a first voltage signal proportional to said charging current;

c. rectifying said first voltage signal to a DC voltage;

d. modulating a current loop with said DC voltage to produce a DC current signal proportional to said charging current for transmission to a remote location;

e. demodulating said current loop at said remote location to extract said DC current signal;

f. converting said DC, extracted current signal to a second voltage signal proportionally to said charging current;

g. comparing said second voltage signal with a plurality of preset voltage levels, each of said plurality of preset levels representative of varying multiples of said charging current and having a predetermined alarm time delay period; and h. generating an alarm signal for each of said plurality of preset voltage levels when said second voltage signal exceeds said preset voltage level and said predetermined alarm time delay.

16. The method of insulation monitoring of claim 15 wherein said method is continuous without interruption of service of said high voltage system.

17. The method of insulation monitoring of claim 15 wherein said high voltage system is a single phase high voltage system.

18. The method of insulation monitoring of claim 15 wherein said method functions simultaneously to individually monitor up to three insulation monitor systems, each of said insulation monitor systems for a different phase of said high voltage system when said high voltage system is a polyphase system.

19. The method of insulation monitoring of claim 15 wherein said insulation between said high voltage conductor and earth ground is a step-graded insulation system.

* * * * *